US008741472B2

(12) United States Patent  
Yamamoto et al.

(10) Patent No.: US 8,741,472 B2
(45) Date of Patent: Jun. 3, 2014

(54) ELECTRIC STORAGE DEVICE

(75) Inventors: Takatoshi Yamamoto, Hitachi (JP); Masahiro Kaneshige, Hitachinaka (JP)

(73) Assignee: Hitachi Vehicle Energy, Ltd., Hitachinaka-shi (JP)

( * ) Notice: Subject to any disclaimer, the term of this patent is extended or adjusted under 35 U.S.C. 154(b) by 307 days.

(21) Appl. No.: 13/243,217

(22) Filed: Sep. 23, 2011

(65) Prior Publication Data

US 2012/0082876 A1 Apr. 5, 2012

(30) Foreign Application Priority Data

Oct. 1, 2010 (JP) .................................. 2010-223996
Jan. 31, 2011 (JP) .................................. 2011-017744

(51) Int. Cl.
*H01M 2/02* (2006.01)
(52) U.S. Cl.
USPC ............... 429/159; 429/90; 429/92; 429/156; 429/158; 180/65.1; 180/65.21; 180/68.5
(58) Field of Classification Search
USPC ............... 429/90, 92, 99–100, 156, 158–159; 180/65.1, 65.21, 68.5; 206/703; 221/282
See application file for complete search history.

(56) References Cited

U.S. PATENT DOCUMENTS

| 5,847,477 | A * | 12/1998 | Shiroyama et al. ............. 310/71 |
| 6,268,566 | B1 | 7/2001 | Takiguchi et al. |
| 6,723,923 | B2 * | 4/2004 | Tsukamoto ................. 174/68.1 |
| 2009/0211781 | A1 | 8/2009 | Suzuki |
| 2010/0248008 | A1 * | 9/2010 | Sugawara et al. ............. 429/159 |
| 2011/0004429 | A1 | 1/2011 | Morita et al. |
| 2011/0290522 | A1 | 12/2011 | Sekino et al. |

FOREIGN PATENT DOCUMENTS

| JP | 63-124785 U | 8/1988 |
| JP | 7-303319 A | 11/1995 |
| JP | 8-191521 A | 7/1996 |
| JP | 11-178174 A | 7/1999 |
| JP | 2000-70589 A | 3/2000 |
| JP | 2002-10440 A | 1/2002 |
| JP | 2003-143736 A | 5/2003 |
| JP | 2003-304619 A | 10/2003 |

(Continued)

OTHER PUBLICATIONS

Japanese-language Office Action dated Jan. 22, 2013 including English language translation (Seven (7) pages).

(Continued)

*Primary Examiner* — Jonathan G Leong
*Assistant Examiner* — James Erwin
(74) *Attorney, Agent, or Firm* — Crowell & Moring LLP

(57) ABSTRACT

An electric storage device includes: a battery block including a chassis with a plurality of storage cells installed therein; a control unit placed on the chassis for monitoring states of the plurality of storage cells based on signals concerning their physical quantities; a plurality of wires arranged on the chassis for directing the signals to the control unit; a confining member fixed on one surface of the chassis, where the control unit is placed, for defining a route along which the plurality of wires are arranged. The confining member includes a first direction restrainer defining the route for bending the wires, withstanding a reaction force accompanying bending of the plurality of wires, and a second direction restrainer withstanding a force exerted by the plurality of wires which are inserted into the route and tend to be lifted up toward a leaving direction from the one surface of the chassis.

8 Claims, 10 Drawing Sheets

(56) References Cited

FOREIGN PATENT DOCUMENTS

| | | |
|---|---|---|
| JP | 2003-304620 A | 10/2003 |
| JP | 2004-166461 A | 6/2004 |
| JP | 2004-206281 A | 7/2004 |
| JP | 2008-034263 A | 2/2008 |
| JP | 2008-92638 A | 4/2008 |
| JP | 2008-154332 A | 7/2008 |
| JP | 2009-27885 A | 2/2009 |
| JP | 2009-177859 A | 8/2009 |
| JP | 2010-114995 A | 5/2010 |
| JP | 2010-118239 A | 5/2010 |
| WO | WO 2008/041377 A1 | 4/2008 |
| WO | WO 2009/107597 A1 | 9/2009 |
| WO | WO 2010/095483 A1 | 8/2010 |

OTHER PUBLICATIONS

Explanation of Circumstances Concerning Accelerated Examination with English Translation submitted to the Japanese Patent Office on Dec. 27, 2012 (seven (7) pages).

* cited by examiner

ELECTRIC STORAGE DEVICE

INCORPORATION BY REFERENCE

The disclosure of the following priority applications are herein incorporated by reference: Japanese Patent Application No. 2010-223996 (filed Oct. 1, 2010), and Japanese Patent Application No. 2011-017744 (filed Jan. 31, 2011).

BACKGROUND OF THE INVENTION

1. Field of the Invention

The present invention relates to an electric storage device.

2. Description of Related Art

In an electric storage device that include a plurality of storage cells, the physical quantities, such as voltages, temperatures and so on, of the plurality of storage cells are input to a control unit through wirings (harnesses) in order to manage and control the state of charge for the plurality of storage cells. The wirings are running in the electric storage device from a plurality of storage cells to a control unit and immovably-supported in places in the electric storage device. As an example for immovable support of the wirings, a pressure-sensitive adhesive tape can be used. Further, the method of immovable support of the wirings as disclosed in Japanese Patent Application Laid-open Publication No. 2008-154332 (JP 2008-154332 A1) may be adopted.

Here, the immovable support method disclosed in JP 2008-154332 A1 is a method of immovably supporting the wirings in an inverter device. In this method, a side wall of the unit case made of sheet metal is partially cut and raised inwardly to form a fixing part for a cable tie, through which the wirings are bundled and fixed by a cable tie inserted inside the unit case.

SUMMARY OF THE INVENTION

The electric storage device can take various configurations, and thus the length and the number (thickness) of wirings may vary depending on the selected configuration. Therefore, the conventional method of immovable support of wirings which utilizes cable ties as explained above cannot always be employed. Even if such a conventional method of immovable support of wirings by cable ties could be employed, it would sometimes happen that the wirings could not be done constantly within a specified range of length from a specified position to another specified position, since such as an external force from the environment is exerted, or since the wirings may give an adverse effect to the environment.

According to the first aspect of the present invention, an electric storage device comprises: a battery block including a chassis with a plurality of storage cells installed therein; a control unit that is placed on one surface of the chassis and monitors states of the plurality of storage cells, by inputting signals concerning respective physical quantities of the plurality of storage cells; a plurality of wires that direct the signals concerning the respective physical quantities of the plurality of storage cells to the control unit and that are arranged on one surface of the chassis in which the control unit is placed, extending from the battery block to the control unit; a confining member that is fixed on one surface of the chassis in which the control unit is placed and defines a route along which the plurality of wires are arranged along the one surface of the chassis with at least one bent portion; wherein the confining member includes a first direction restrainer that defines the route, withstanding a reaction force accompanying bending of the plurality of wires, and a second direction restrainer that withstands a force exerted by the plurality of wires which are inserted into the route and tend to be lifted up toward a leaving direction from the one surface of the chassis.

According to the 2nd aspect of the present invention, in an electric storage device according to the 1st aspect, it is preferred that the first direction restrainer includes a first direction confining member that confines the plurality of wires not to protrude from side surfaces of the battery block.

According to the 3rd aspect of the present invention, in an electric storage device according to the 1st aspect, it is preferred that the second direction restrainer includes a second direction confining member that confines the plurality of the wires not to be lifted up by more than a predetermined height from the one surface of the battery block.

According to the 4th aspect of the present invention, in an electric storage device according to the 1st aspect, it is preferred that the confining member further includes a bottom plate set on the one surface of the battery block, the first direction restrainer includes a pair of walls that are rising upward on the bottom plate so as to define a space serving as the route above the bottom plate and keep the plurality of wires inserted in the route to be in an apposed state, and the second direction restrainer includes a protrusion that protrudes from the pair of walls into the route, or a wall that is provided parallel to the bottom plate at a predetermined distance therefrom.

According to the 5th aspect of the present invention, in an electric storage device according to the 1st aspect, it is preferred that the second restrainer includes a withstanding/protecting member that prevents the plurality of wires from lifting up away from the one surface of the battery block and receives external force exerted to the one surface of the battery block.

According to the 6th aspect of the present invention, in an electric storage device according to the 1st aspect, it is preferred that the second restrainer includes at least three restrainers, i.e., a first restraining member, a second restraining member, and a third restraining member, the first restraining member restrains lifting up of a portion of the plurality of wires, the second restraining member restrains lifting up of the other portion of the plurality of wires, and the third restraining member restrains lifting up of the plurality of wires.

According to the 7th aspect of the present invention, in an electric storage device according to the 1st aspect, it is preferred that the first restraining member and the second restraining member are integrally molded.

According to the 8th aspect of the present invention, in an electric storage device according to the 7th aspect, it is preferred that the confining member includes a rotation preventing member that prevents rotation of the confining member in cooperation with a rotation preventing unit provided on the one surface of the battery block.

According to the 9th aspect of the present invention, in an electric storage device according to the 1st aspect, it is preferred that the plurality of wires are connected at its one end to a single connector, and are divided into four groups at its another end and are connected to four branched connectors, respectively, the single connector is connected to a connector that is fixed to the control unit, and the four branched connectors are connected respectively to four connection terminals provided to the battery blocks for signals concerning physical quantities.

According to the 10th aspect of the present invention, in an electric storage device according to the 9th aspect, it is preferred that the plurality of wires connected to the single connector is confined by the confining member to be bent twice at a first bent portion and a second bent portion to be arranged along longitudinal direction of the battery block, the plurality of wires, which are bent at the second bent portion and are divided into the four groups, are respectively connected to the four branching connectors provided on both shorter sides of the battery block.

According to the 11th aspect of the present invention, in an electric storage device according to the 9th aspect, it is preferred that the connector of the control unit that is connected to the single connector is arranged along a shorter side direction of the battery block.

According to the 12th aspect of the present invention, in an electric storage device according to the 1st aspect, it is preferred that the wirings are each covered with a silicone varnish glass tube.

According to the present invention, an electric storage device can be provided which allows for stable arrangement of wirings between designated positions within a designate range in, for example, an electric vehicle on which the electric storage device is mounted.

DESCRIPTION OF PREFERRED EMBODIMENTS

An electric storage device according to an embodiment of the present invention is explained with reference to the attached drawings.

Embodiment

The present embodiment relates to an example in which the present invention is applied to an electric storage device that constitutes in-vehicle power source device of an electromotive vehicle, particularly an electric vehicle. Examples of the electric vehicle include a hybrid electric vehicle provided with an engine that is an internal combustion engine and an electric motor as power sources for driving the vehicle, and a pure electric vehicle provided with an electric motor as the only power source for driving the electric vehicle.

Herein it is explained assuming that the electric storage device is constituted by a battery module and a control unit, and the electric module is constituted by a plurality of battery blocks, where each battery block is constituted by an assembled battery that includes a plurality of battery cells installed in a casing.

Figure 1:
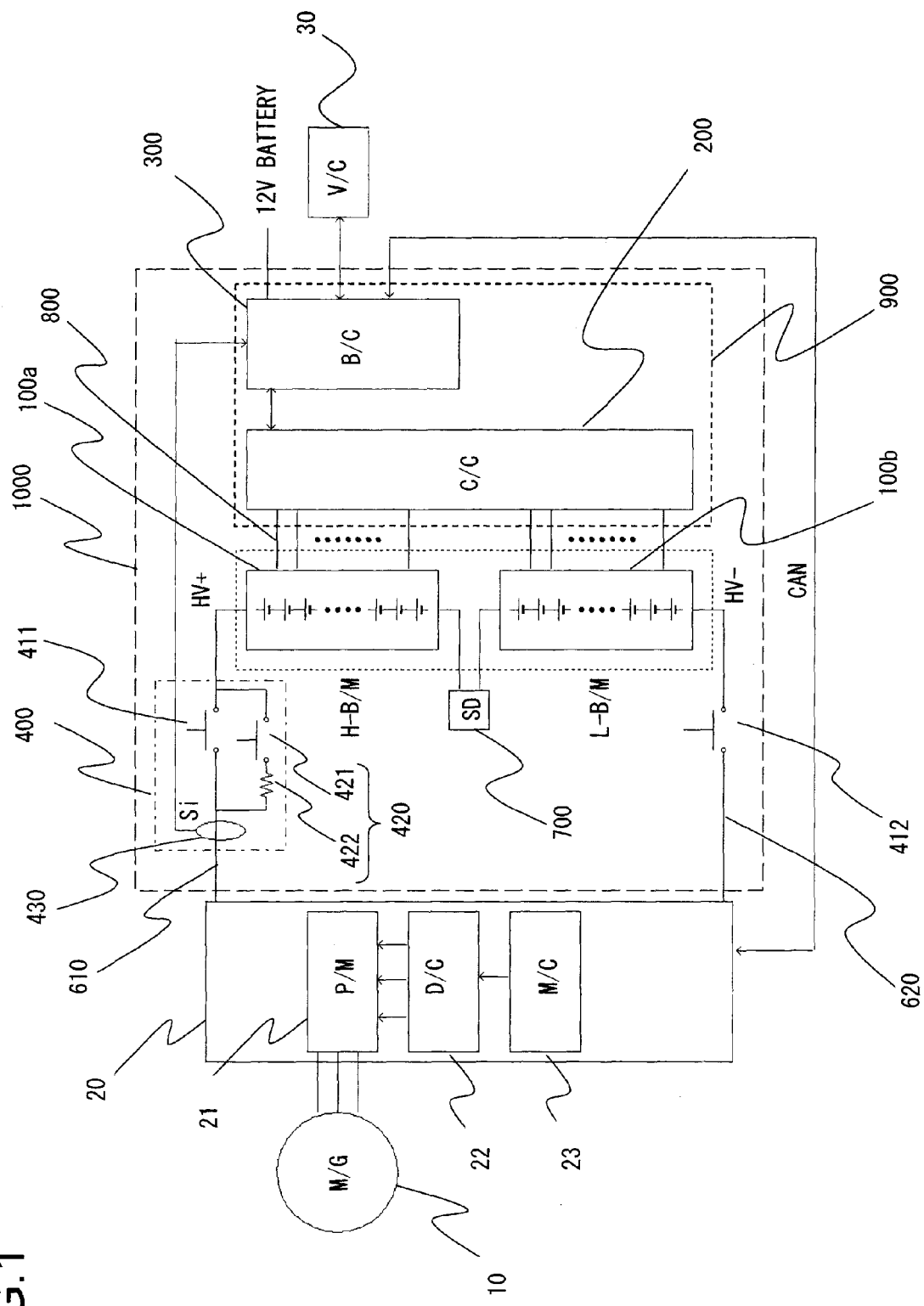
FIG. 1 presents a block diagram showing an in-vehicle electro-mechanical system using the electric storage device according to an embodiment of the present invention.

Referring to FIG. 1, explanation is made on the configuration of the in-vehicle electro-mechanical system (electromotive-drive system) that includes the electric storage device according to the present embodiment.

In-Vehicle Electric System

The in-vehicle electric system includes a motor-generator 10, an inverter device 20, a vehicle controller 30 that controls the vehicle totally, an electric storage device 1000 that constitutes an in-vehicle power source device, and so on. The electric storage device 1000 includes a plurality of storage cells, and, for example, is constituted as a lithium ion battery device provided with a plurality of lithium ion battery cells.

Motor Generator

The motor generator 10 is a three-phase AC synchronous machine. The motor generator 10 is driven as a motor for supplying the generated rotation power to members such as wheels and engine to be driven, when the rotation power is needed in such an operation mode as that the vehicle is power driven or that the engine, an internal combustion engine, is started. In this case, the motor-generator is supplied with 3-phase AC power that has been converted from DC power of the lithium ion battery 1000 device by the inverter device 20 that is an power conversion device.

In a mode where generation of electric power is needed such as a case when regeneration is performed, e.g., upon deceleration or braking of the vehicle, and a case when charging of the lithium ion battery device 1000 is needed, the motor generator 10 is driven to rotate by using a driving force from the wheels or engine and serves as a generator to generate 3-phase alternating power. In this case, the 3-phase alternating power from the motor generator 10 is converted to direct current power through the inverter device 20, and this direct current power is fed to the lithium ion battery device 1000. As a result, power is stored in the lithium ion battery device 1000.

Inverter Device 20

The device 20 is an electronic circuit unit that performs power conversion as explained above. More specifically, conversion of DC power into 3-phase AC power is performed by operations (on/off) of switching semiconductor elements as mentioned above, and conversion of three-phase AC power into DC power is performed. The inverter device 20 includes a power module 21, a driver circuit 22, and a motor controller 23.

The power module 21 is a power conversion circuit that includes six (6) switching semiconductor elements, which circuit performs the above-mentioned power conversion from DC power to 3-phase AC power by switching operations (on/off) of the six switching semiconductor elements.

As the switching semiconductor element, there can be used, for example, a metal oxide film semiconductor type field effect transistor (MOSFET) or an insulated gate type bipolar transistor (IGBT). When the power module 21 is constituted by MOSFETs, a parasite diode is parallel-connected between the drain and electrode with reversed polarity. On the other hand, when the power module 21 is constituted by IGBTs, it is necessary to connect a separate diode parallel in each IGBT between the collector and emitter with reversed polarity.

The power module 21 is constituted by a 3-phase bridge circuit including three series circuits parallelly connected to each other, each series circuit (an upper arm and a lower arm for one phase) having two (upper arm and lower arm) switching semiconductor elements that are series-connected to each other.

The power module 21 is provided with a DC positive electrode side module terminal (not shown) and a DC negative electrode side module terminal (not shown). A side of each upper arm opposite to a side where each upper arm is connected to each corresponding lower arm is electrically connected to the DC positive electrode side module terminal. A side of each lower arm opposite to a side where each lower arm is connected to each corresponding upper arm is electrically connected to the DC negative electrode side module terminal. The DC positive electrode side module terminal and the DC negative electrode side module terminal are electrically connected to a DC positive electrode side external terminal (not shown) and a DC negative electrode side external terminal (not shown), respectively. The DC positive electrode side external terminal and the DC negative electrode side external terminal are power source side terminals for transferring the DC power from and to the lithium ion battery 1000, and high tension DC power cables 610 and 620 extending from the lithium ion battery device 1000 are connected thereto.

The power module 21 is provided with an AC side module terminal (not shown), which is electrically connected to AC side external terminals (not shown). The AC side external terminals are the terminals for transferring the 3-phase AC power to and from the motor generator 10, and the three-phase AC cables that extend from the motor generator 10 are electrically connected to the external terminals.

Motor Controller 23

The motor controller 23 is an electronic circuit unit for controlling switching operations of the six switching semiconductor elements that constitute the power module 21. The motor controller 23 generates switching operation command signals (for example, PWM (pulse width modulation signal)) for the six switching semiconductor elements based on a torque command output from an upper control unit, for example, a vehicle controller 30 that controls the vehicle totally. The generated command signals are output to a driver circuit 22.

The driver circuit 22 generates drive signals for the six switching semiconductor elements that constitute the power module 21 based on the switching operation command signals output from the motor controller 23. The drive signals are output to respective gate electrodes of the six switching semiconductor elements that constitute the power module 21. With this configuration, switching (on/off) of the six switching semiconductor elements that constitute the power module 21 is controlled based on the drive signals output from the driver circuit 22.

The electric storage device, which is the lithium ion battery device 1000, includes a battery module 100 that stores and releases electric energy (i.e. charges and discharges DC power) and a control unit 900 for managing (monitoring) and controlling the state of the battery module 100.

The battery module 100 is constituted by two battery blocks (or battery packs), i.e., a higher potential side battery block 100a and a lower potential side battery block 100b that are electrically connected in series to each other.

A cell controller 200 is so-called a lower controller of a battery controller 300, an upper controller. The cell controller 200 performs management and control of a plurality of lithium ion battery cells 140 based on commands from the battery controller 300. The cell controller 200 is constituted by a plurality of cell controlling integrated circuits (ICs).

Management and control of the state of the plurality of lithium ion battery cells 140 includes measurement of voltage of each lithium ion battery cell 140, adjustment of electric storage amount of each lithium ion battery cell 140, and so on. To each cell controlling integrated circuit a plurality of lithium ion battery cells 140 are allotted, and each cell controlling integrated circuit performs management and control of the state of the plurality of the corresponding lithium ion battery cells 140.

As power source used in each cell controlling integrated circuit constituting the cell controller 200 the total terminal voltage of all of the plurality of lithium battery cells 140 corresponding to each cell controlling integrated circuit. The cell controller 200 and the battery module 100 are connected to each other through harnesses (connection wirings) 800 formed by bundling a plurality of voltage detection lines that connect positive and negative terminals of each lithium ion battery to the cell controlling integrated circuits (see FIG. 2 and FIG. 7). The harnesse include wirings of temperature sensors (not shown) that measure temperatures of the battery blocks. In each cell controlling integrated circuit, the voltage of the highest potential among the voltages of the plurality of lithium ion battery cells 140 corresponding to this cell controlling integrated circuit, which is supplied through the harness (connection wirings) 800, is used as the power source.

The positive electrode terminal of the high potential side battery block 100a and the DC positive electrode side external terminal of the inverter device 20 are electrically connected to each other through a positive electrode side high tension DC power cable 610. The negative electrode terminal of the lower potential side battery block 100b and the DC negative electrode side external terminal of the inverter device 20 are electrically connected to each other through a negative electrode side high tension DC power cable 620.

To the positive electrode side high pressure direct current power cable 610 is provided on its way with a junction box 400 and to the negative electrode side high pressure direct current power cable 620 is provided on its way with a negative electrode side main relay 412. Inside the junction box 400 is installed a relay structure that is constituted by a positive electrode side main relay 411 and a precharge circuit 420. The relay structure is a switching unit that performs electrical continuity and discontinuity between the battery module 100 and the inverter device 20. The relay structure makes the battery module 100 and the inverter device 20 continuous upon starting the vehicle, and makes the battery module 100 and the inverter device 20 discontinuous upon stopping the vehicle or upon occurrence of an abnormality in the in-vehicle electrro-mechanical system. By controlling the conduction between the lithium ion battery device 1000 and the inverter device 20 by the relay structure, high safety of the vehicle can be assured.

The relay structure is driven and controlled by the motor controller 23. Upon starting up the vehicle, by receiving a notice from the battery controller 300 that start up of the lithium ion battery device 1000 has been completed, the motor controller 23 outputs a command signal to make the relay structure continuous for driving the relay structure to be electrically continuous, and thus it makes the battery module 100 and the inverter device 20 continuous. The motor controller 23 outputs a command signal to make the relay mechanism discontinuous for driving the relay structure to be electrically discontinuous, and thus it makes the battery module 100 and the inverter device 20 discontinuous by receiving an output signal of "off" from an ignition key switch upon stopping the vehicle, or by receiving an abnormality signal from the vehicle controller when the vehicle is in an abnormal state.

The positive electrode side main relay 411 is provided on the way of the positive electrode side high tension DC power cable 610 and controls electrical connection between the positive electrode side of the lithium ion battery device 1000 and the positive electrode side of the inverter device 20. The negative electrode side main relay 412 is provided on the way of the negative electrode side high tension DC power cable 620 and controls electrical connection between the negative electrode of the lithium ion battery device 1000 and the negative electrode of the inverter device 20.

The precharge circuit 420 is a series circuit that electrically connects a precharge relay 421 and a resistor 422 in series to each other and is connected electrically parallel to the positive electrode side main relay 411.

Upon starting up the in-vehicle electro-mechanical system, first the negative electrode side main relay 412 is turned on and then the precharge relay 421 is turned on. As a result, a smoothing capacitor (not shown) in the inverter device is charged under the condition that the amount of current to be supplied from the lithium ion battery device 1000 is limited by the resistor 422. After the smoothing capacitor is charged up to a predetermined voltage, the positive electrode side main relay 411 is turned on and the precharge relay 421 is turned off. In this way, main current is supplied from the lithium ion battery device 1000 to the inverter unit 20 through the positive electrode side main relay 411.

Inside the junction box 400 is installed a current sensor 430. The current sensor 430 is introduced to detect the current supplied from the lithium ion battery device 1000 to the inverter device 20. An output line of the current sensor 430 is electrically connected to the battery controller 300. The battery controller 300 detects the current supplied from the lithium ion battery device 1000 to the inverter device 20 based on a signal output from the current sensor 430. Information on the result of the current detection (voltage detection information) is transmitted from the battery controller 300 to the motor controller, the vehicle controller 30, and so on.

The current sensor 430 may be installed outside the junction box 400. The detection position of the current of the lithium ion battery device 1000 may be not necessarily only on the side of inverter device 20 of the positive electrode side main relay 411, but also on the side of battery module 100 of the positive electrode side main relay 411.

It should be noted that a voltage sensor (not shown) may be provided between the positive electrode side high tension DC power cable 610 and the negative electrode side high tension DC power cable 620 for detecting a voltage of the lithium ion battery device 1000. The battery controller 300 detects a total voltage of the lithium ion battery device 1000 based on an output signal of the voltage sensor. The voltage detection information is transmitted to the motor controller 23 and the vehicle controller 30. The detection position of the voltage of the lithium ion battery device 1000 is usually on the side of battery module 100 of the relay structure. Besides the voltage sensor, the inverter device 20 is provided with a separate circuit (not shown) that detects applied DC high voltage.

Lithium Ion Battery Device

Figure 2:
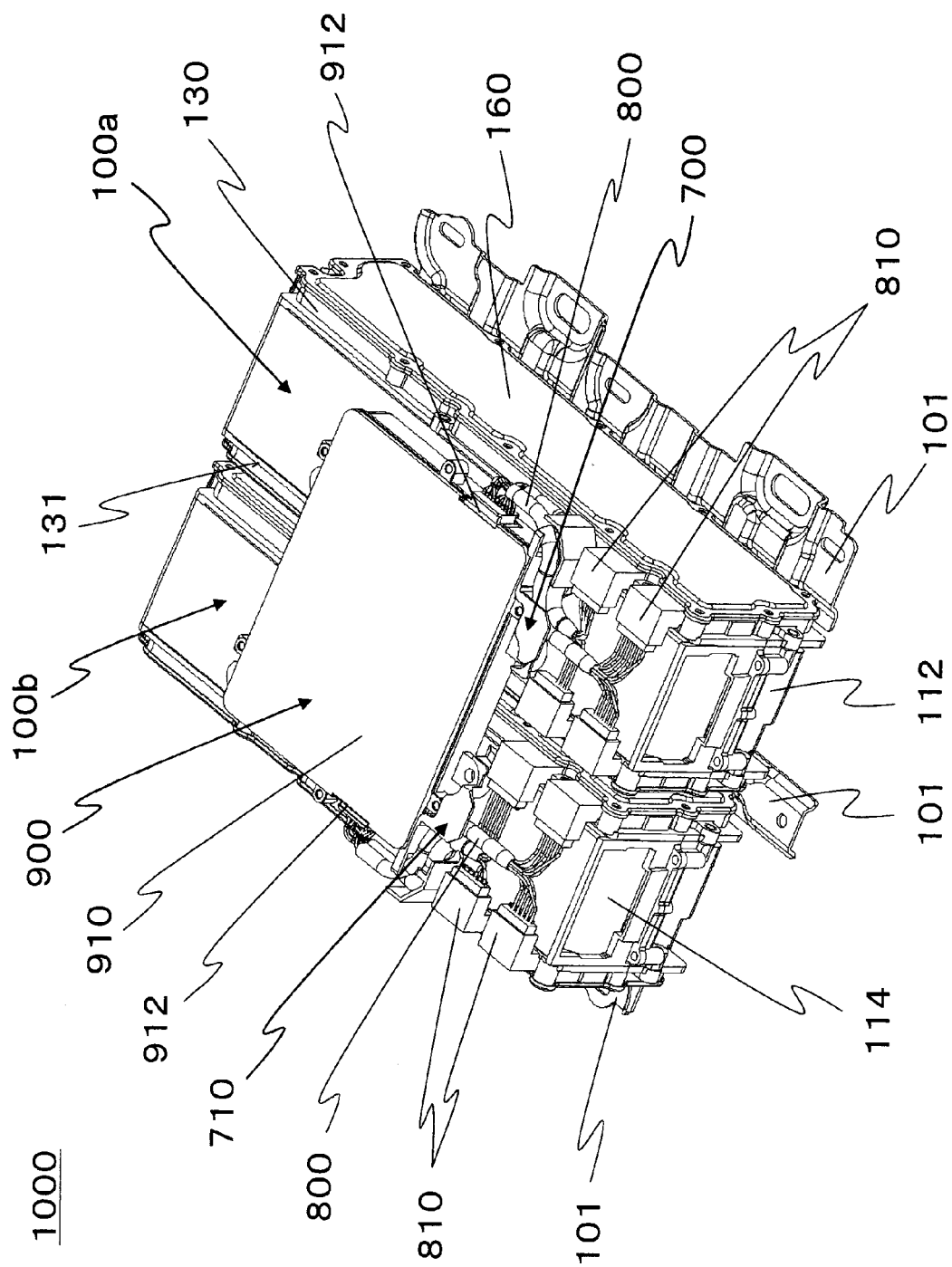
FIG. 2 presents a perspective external view showing an overall structure of a lithium ion battery device according to an embodiment of the present invention.
Figure 3:
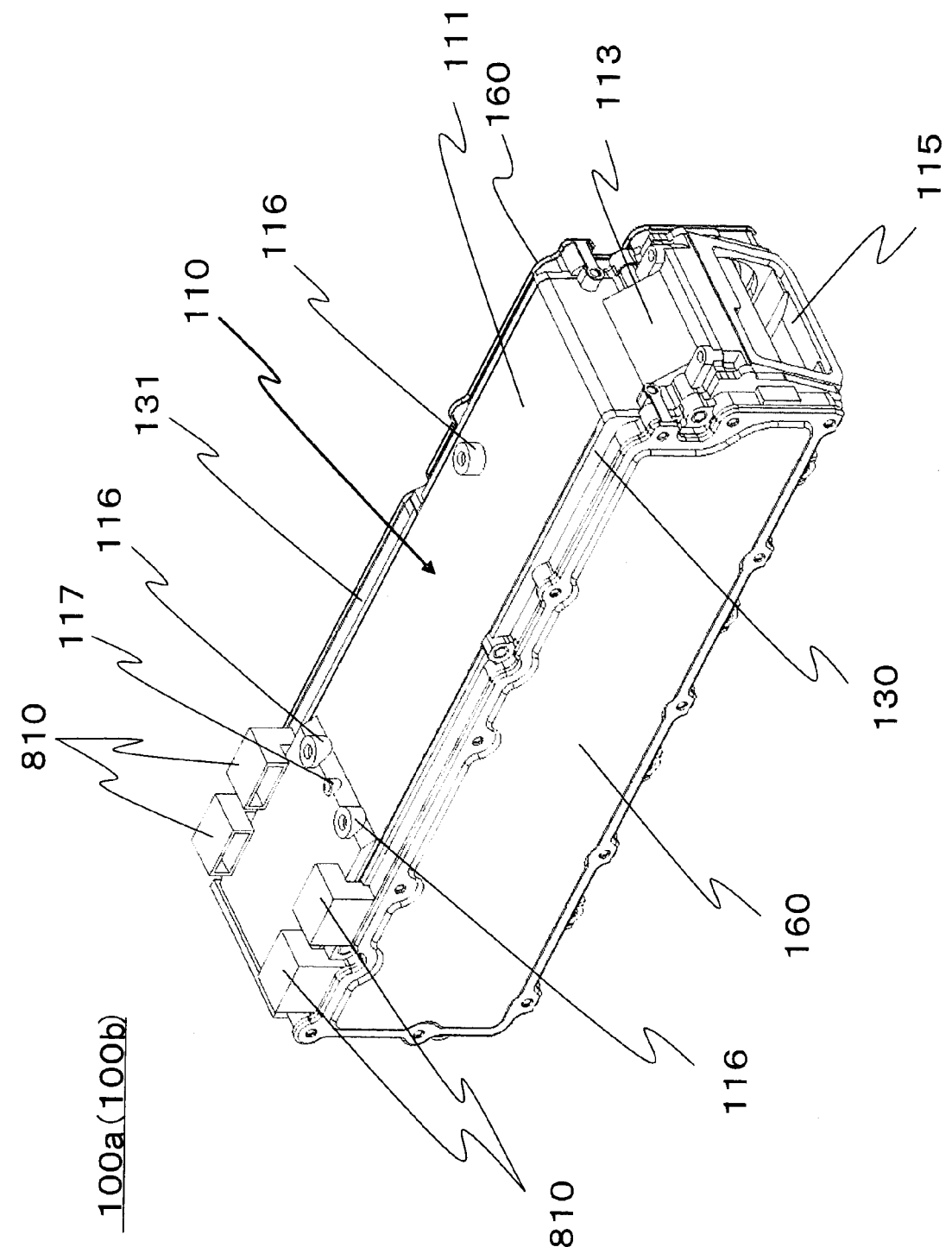
FIG. 3 presents a perspective external view showing an overall structure of a single battery block that constitutes a lithium ion battery device according to an embodiment of the present invention.
Figure 4:
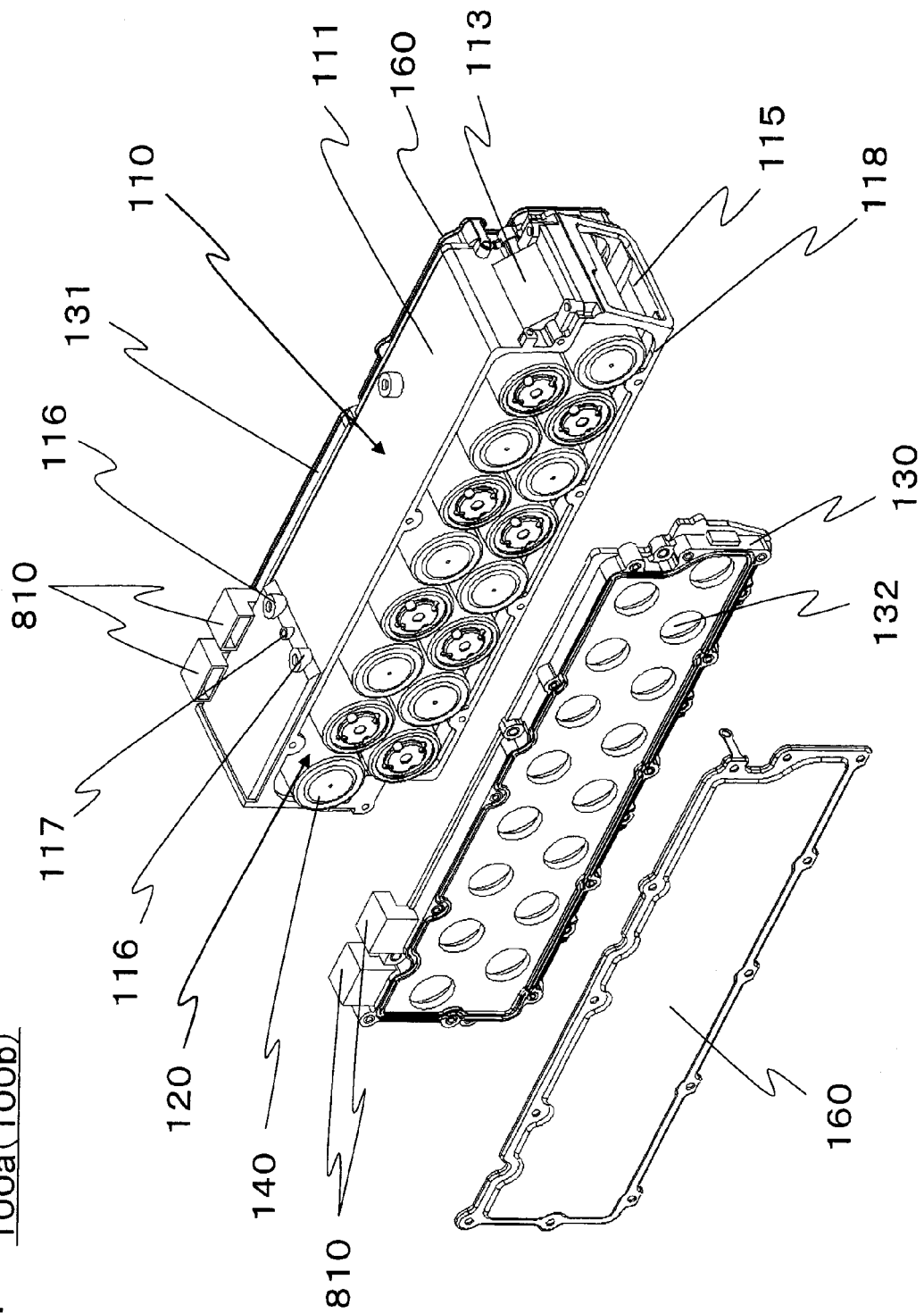
FIG. 4 presents a perspective exploded view of the battery block shown in FIG. 2.

Referring to FIGS. 2 to 4, the configuration of the lithium ion battery device 1000 is explained. FIG. 2 presents a perspective external view showing the overall structure of the lithium ion battery device 1000. FIG. 3 presents a perspective external view of a battery block that constitutes the lithium ion battery device 1000. FIG. 4 presents a perspective exploded view of the battery block shown in FIG. 3.

The lithium ion battery device 1000 is constituted basically by two units, i.e., the battery module 100 and a control device 900. First, the configuration of the battery module 100 is explained.

As mentioned above, the battery module 100 is constituted by the higher potential side battery block 100a and the lower potential side battery block 100b. The two battery blocks 100a and 100b are electrically connected to each other in series. The higher and lower potential side battery blocks 100a and 100b have quite the same configuration.

Therefore, representing the higher and lower potential side battery blocks 100a and 100b, only the higher potential side battery block 100a is shown in FIGS. 3 and 4, and explanation of the configuration of the lower potential side battery block 100b is omitted hereafter.

As shown in FIG. 2, the higher potential side battery block 100a and the lower potential side battery block 100b are in parallel arranged closely to each other such that the longitudinal directions of the blocks are parallel to each other. The higher potential side block 100a and the lower potential side battery block 100b are arranged side by side on a module base 101 and fixed thereto with a fixing means such as a bolt. The module base 101 is constituted by three pieces of rigid thin metal plates (for example, iron plate) that are separated into three pieces along the shorter side direction and are fixed to the vehicle. That is, the module base 101 is constituted by three members to be placed at both ends along the shorter side direction of the battery blocks and at the center thereof.

The higher potential side battery block 100a and of the lower potential side battery block 100b are connected on their top sides with a casing 910 of the control unit 900. About the control unit 900, it will be explained later.

As shown in FIG. 3, the higher potential side battery block 100a is basically constituted by the casing (also sometimes referred to as "chassis", "housing", or "package") 110 and an assembled battery 120 (see FIG. 4). The assembled battery 120 is installed and held inside the casing 110.

The casing 110 is constituted by a substantially rectangular parallelepiped block chassis. More specifically, the casing 110 is constituted by a combination of six members, i.e., an inlet flow channel forming plate 111, an outlet flow channel forming plate 118, an inlet side guide plate 112, an outlet side guide plate 113, and two side plates 130 and 131. An inner space of the casing 110 serves as an installation room in which the assembled battery 120 is installed.

It should be noted that, in the following explanation, "longer side direction" (or "longitudinal direction") is defined to be a direction along which the length of the casing 110 is greatest, or a direction from the side of a coolant inlet 114 (see FIG. 2) to the side of a coolant outlet 115 (see FIG. 3). Moreover, "shorter side direction" is defined as the direction through which two sides (two side plates 130 and 131) facing each other, which are the sides different from the two sides (the inlet side guide plate 112 (see FIG. 2) and the outlet side guide plate 113 (see FIG. 3)) facing each other, or as the direction of central axis of the lithium ion battery cell 140 (a direction passing through the two electrodes, i.e., the positive electrode terminal and the negative electrode terminal of the lithium ion battery cell). In addition, a direction along which the inlet flow channel forming plate 111 and the outlet flow channel forming plate 118 face each other is defined to be a height direction regardless of the direction along which the battery block 100a is arranged.

The inlet flow channel forming plate 111 is a substantially rectangular plate that forms a top surface of the casing 110. The outlet flow channel forming plate 118 is a substantially rectangular plate that forms a bottom surface of the casing 110. The inlet flow channel forming plate 111 and the outlet flow channel forming plate 118 are arranged such that positions of their ends along the longer side direction are different in the longer side direction. The inlet flow channel forming plate 111 and the outlet flow channel forming plate 118 are each made of a rigid thin metal plate.

The inlet side guide plate 112 is a plate-like member that forms one of the sides that face each other in the longer side direction of the casing 110. The outlet side guide plate 113 is a plate-like member that forms another of the sides facing each other in the longer side direction of the casing 110. The inlet side guide plate 112 and the outlet side guide plate 113 are each made of a rigid thin metal plate.

Between the inlet flow channel forming plate 111 and the inlet side guide plate 112 is formed a coolant inlet 114 that constitutes an entrance for cooling air, which is used as coolant, into the inside of the casing 110. As explained above, the inlet side guide plate 112 and the outlet side guide plate 113 are not aligned to each other, and the inlet side end of the casing 110 is formed like a step. Between the outlet flow channel forming plate 118 and the outlet side guide plate 113 is formed a coolant outlet 115 that constitutes a discharge hole for the cooling air from the inside of the casing 110.

In order to make the assembly work of the battery block easier, the inlet flow channel forming plate 111, the outlet side guide plate 113, and the coolant inlet 114 are integrally formed, and the outlet flow channel forming plate 118, the inlet side guide plate 112, and the coolant outlet 115 are integrally formed.

The integral structure constituted by the inlet flow channel forming plate 111, the outlet side guide plate 113, and the coolant inlet 114, and the integral structure constituted by the outlet flow channel forming plate 118, the inlet side guide plate 112, and the coolant outlet 115 are fabricated with metal by metal mold casting and thus have thicknesses greater than the thickness of the chassis fabricated by sheet-metal bending. Accordingly, they have higher strengths against load or impact from outside and having higher size precision of screw holes and processing surface than the one fabricated by sheet-metal working, so that they can be readily assembled with other components.

The inlet flow channel forming plate 111, the outlet flow channel forming plate 118, the inlet side guide plate 112, the outlet side guide plate 113, the coolant inlet 114, and the coolant outlet 115 are connected to the side plates 130 and 131 with fixing means (not shown) such as screws, bolts or rivets.

On the top surface of the inlet flow channel forming plate 111 is provided three boss units. Two of the boss units are each formed with a screw hole 116 of female threads and the rest boss unit is formed with a position adjustment hole 117, which is a cylindrical hole. The screw holes 116 and the position adjustment hole 117 are used to fix harness guards 700 and 710 to the battery blocks 100a and 100b, respectively.

The side plates 130 and 131 are plate-like members constituting two sides facing in the shorter side direction of the casing 110. The side plates 130 and 131 are molded with a resin having electrical insulation property, such as polybutylene terephthalate (PBT). Detailed structures of the side plates 130 and 131 are described later.

Outside the side plates 130 and 131, that is, on the side opposite to the installation chamber for installing the assembled battery 120 are provided cover members 160, which are called "side covers". Although FIG. 2 shows only the cover member 160 that is arranged outside the side plate 130, the cover member 160 is provided also outside the side plate 131. The cover members 160 are fixed to the side plates 130 and 131 with fixing means (not shown) such as bolts and rivets.

The cover plates 160 are plates formed by pressing a metal plate made of, for example, iron or aluminum, or a plate formed by molding a resin such as PBT. The cover plates 160 are each formed to have a planar shape, which is substantially the same as that of the side plate 130. The cover plates 160 have each a swelled portion that swells uniformly on a side opposite to the side plate 130 at each area including a site corresponding to a through-hole 132 of the side plate 130 described later. As a result, a space is formed between outside the side plate 130, that is, an outer wall opposite to an inner wall forming the installation chamber of the assembled battery 120 and an inner wall of the cover plate 160, that is, a surface of the cover plate 160 on the side plate 130 side. This space serves as a gas flow passage.

The assembled battery 120 is an assembly of a plurality of lithium ion battery cells 140 (lithium ion battery cell group). The plurality of lithium ion battery cells 140 are installed in the installation chamber formed inside the casing 110 in alignment and at the same time sandwiched with the side plates 130 and 131 in the shorter side direction, and are electrically connected in series by joining with a plurality of electroconductive members called bus bars (not shown).

The lithium ion battery cell 140 has a cylindrical structure, which is constituted by a battery case 2 within which components such as battery elements and safety valves are installed and an electrolyte is filled.

Now, the structure of the side plates 130 and 131 is explained. Herein, for simplicity's sake, the structure of only one of the side plates, i.e., the side plate 130 is explained. The other side plate 131 is structured basically the same as the side plate 130.

However, a positive electrode side connection terminal (not shown) that is electrically connected to the positive electrode side of the assembled battery 120 and a negative electrode side connection terminal (not shown) that is electrically connected to the negative electrode side of the assembled battery 120 are provided only on the side plate 130. The positive electrode side connection terminal and the negative electrode side connection terminal are integrally molded to the side plate 130 using the same molding material as that of the side plate 130. The two connection terminals are arranged side by side in the longer side direction on the top surface of the side plate 130, i.e., a surface on the inlet flow channel forming plate 111 side. The voltage of the assembled battery 120, which is connected in series inside the battery block 100a or 100b, is taken out from the battery blocks 100a or 100b by using the positive electrode side connection terminal and the negative electrode side connection terminal (not shown).

The negative electrode side connection terminal of the higher potential side battery block 100a and the positive electrode side connection terminal of the lower potential side battery block 100b are electrically connected to each other, though not shown. By using the positive electrode side connection terminal of the higher potential side block 110a and the negative electrode side connection terminal of the lower potential side battery block 100b, the voltage of the lithium ion battery device 1000 is taken out.

As shown in FIG. 4, the side plate 130 is formed to have a substantially rectangular plate-like shape and is formed of through-holes 132 in accordance with the arrangement of the lithium ion battery cells 140. In a space between outside the side plate 130, that is, the side opposite to the installation chamber for the assembled 120, and the cover plate 160, is arranged an electroconductive member (not shown) called bus bar between the through-holes 132, connecting the lithium ion battery cells 140, thus the lithium ion batteries 140 in the battery blocks 100a and 100b respectively are connected in series.

The electroconductive member is configured to be a separate member from the side plate 130 and is a plate-like member made of a metal, for example, copper, which plate-like member electrically connects the lithium ion battery cells 140 to each other. The electroconductive member and the lithium ion battery cells 140 are joined with each other by TIG welding.

On the top surface of the side plate 130, that is, on the surface on the inlet flow channel forming plate 111 side is provided with a connection terminal 810. The connection terminal 810 is integrally molded with the same molding material as that of the side plate 130 and is arranged on the coolant inlet 114 side on the top surface of the side plate 130. Each connection terminal 810 electrically connects a harness (connection wires) 800 extending from a voltage detection connector 912 of the control unit 900 and voltage detection conductors (not shown) to be described later. The voltage detection connectors 912 are provided on both ends of the control unit 900 in the shorter side direction of the control unit 900. Connection of the connectors 912 are done on the both sides of the control unit 900 in its shorter side direction, by which it becomes easier to connect/disconnect the connectors 912. The connection wires 800, which are connected to the connection terminals 810 provided on the higher potential side battery block 100a, are connected to the connector 912 of the control unit 900 arranged above the higher potential side battery block 100a. On the other hand, the connection wires 800, which are connected to the connection terminals 810 provided on the lower potential side battery block 100b, are connected to the connectors 912 of the control unit 900 arranged above the lower potential side battery block 100b.

The lengths of the connection wires 800 is set so as to correspond to a distance from each connection terminal 810 to the connector 912 that correspond to each connection terminal 810 in order to prevent mistakes in wiring from occurring. For example, the connection wires 800, which are connected to the connection terminal 810 of the higher potential side battery block 100a, are set such that it will not reach the connector 912 for the lower potential side battery block 100b.

The voltage detection conductor (not shown) is connected to the electroconductive members (not shown) that connect the lithium ion battery cells 140 in series, in order to detect respective voltages of the plurality of lithium ion battery cells 140 that constitutes the assembled battery 120.

The voltage detection conductor is constructed with a plurality of detection lines (i.e. voltage detection lines, not shown), which are fabricated, for example, each by pressing a thin plate of metal such as copper into an elongated thin rectangular wire shape. The voltage detection conductor is constructed to extend such that the detection line will not largely protrude from each of the plurality of through-holes 132 formed in the side plate 130. But the ends of the detection lines are exposed from insulation covering on the through-holes 132. The electroconductive member and the end of the detection line are joined with each other by TIG welding. The other ends of the detection lines, which are the other ends opposite to the ends of the detection lines of voltage detection conductors, are electrically connected to the connection terminal 810.

The voltage detection conductors are integrally formed with the side plate 130, for example, by insert mold forming with the resin that constitutes the side plate 130. Since the detection lines are fixed with resin, separately from each other, substantially no short-circuiting of the detection lines will occur when the voltage detection conductor is integrated with the side plate 130.

As shown in FIG. 2, the control unit 900 is fixed to the higher potential side battery block 100a and the lower potential side battery block 100b with a plurality of bolts or screws such that they bridge over the battery blocks 100a and 100b.

Figure 5:
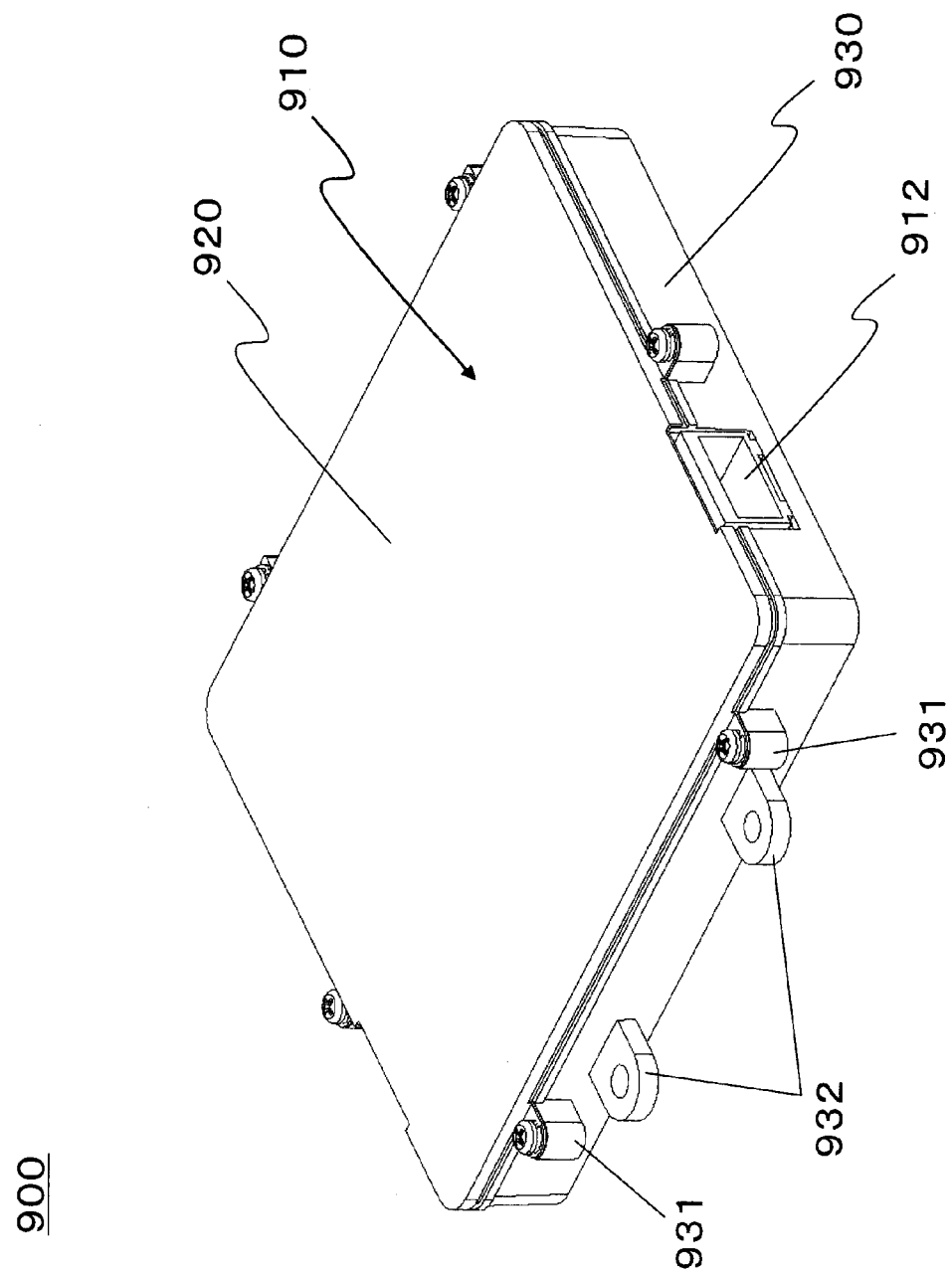
FIG. 5 presents a perspective external view showing an overall structure of a control unit that constitutes the lithium ion battery device shown in FIG. 1.
Figure 6:
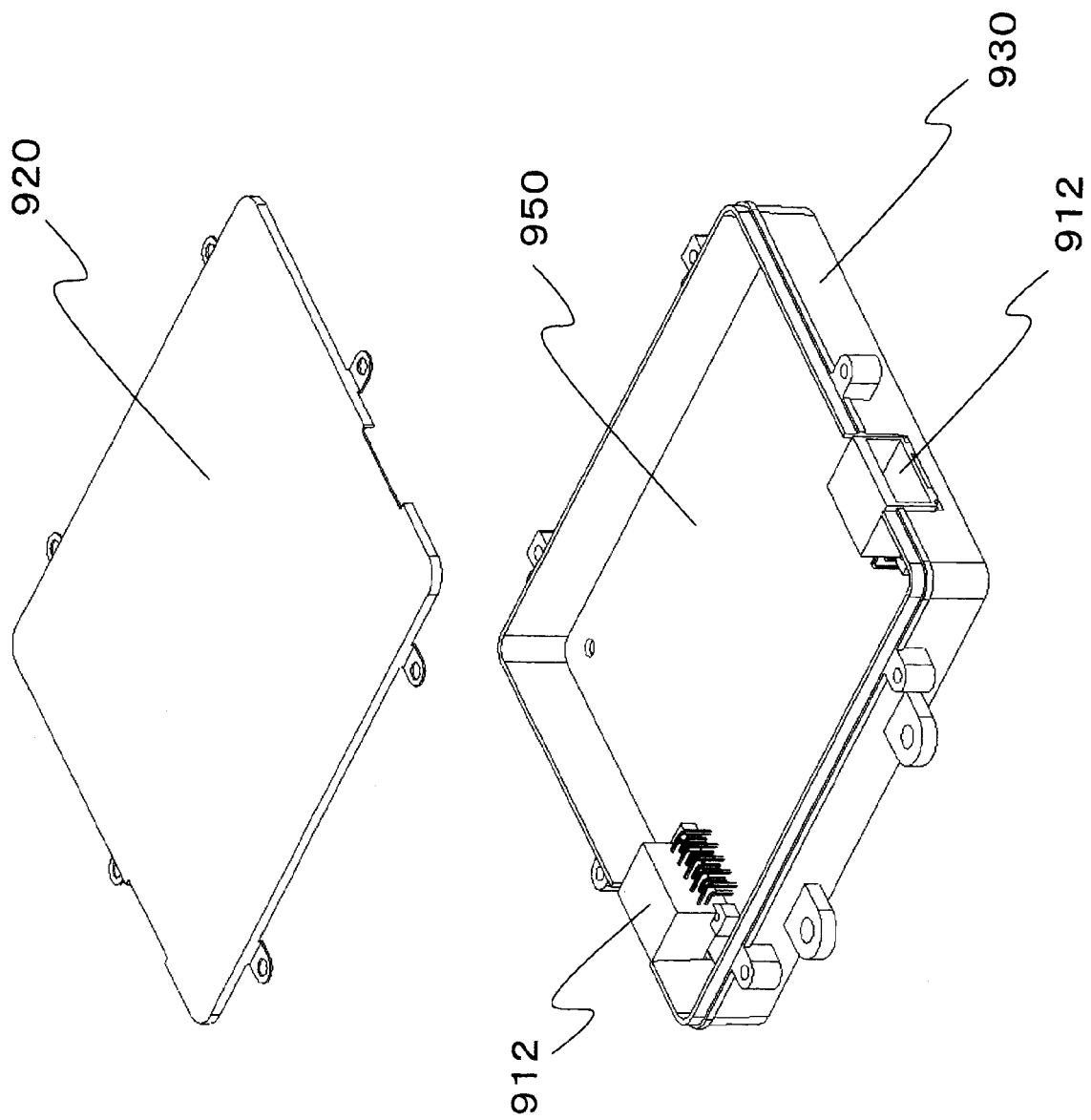
FIG. 6 presents a perspective exploded view of the control unit shown in FIG. 5.

The control unit 900 is basically constituted by a chassis 910 and a circuit board 950, as shown in FIGS. 5 and 6. Inside the chassis 910, the circuit board 950 is installed and held. The chassis 910 is a flat rectangular parallelepiped box made of a metal, and is constituted by a chassis cover 920 that forms an upper surface of the chassis 910 and a chassis case 930 that forms a lower surface and side surfaces of the chassis 910. The chassis cover 920 and the chassis case 930 are fastened to each other with screws through a fastening unit 931. A pair of bosses 932 are provided on one side of the chassis case 930, and on the opposite side again a pair of bosses 932 (not shown) are provided. On the other hand, boss units 116 each having a screw hole are provided on the upper surface of the inlet flow channel forming plate 111 so as to project therefrom. The control unit 900 is fixed to the battery blocks 100a and 100b by mounting each boss 932 on one of the two boss units 116 of the inlet flow channel forming plate 111 of the higher potential side battery block 100a or of the lower potential side battery block 100b, and fastening these with screws.

On the circuit board 950 are connected a plurality of electronic components (the cell controller 200, the battery controller 300, and so on shown in FIG. 1) and a plurality of voltage detection connectors 912 by soldering. The circuit board 950 and the chassis case 930 are fixed with a plurality of screws.

Connection Wires (Harnesses)

Referring to FIGS. 7 to 10, the connection wires 800 and harness guards 700 and 710 therefor are explained in detail.

Figure 7:
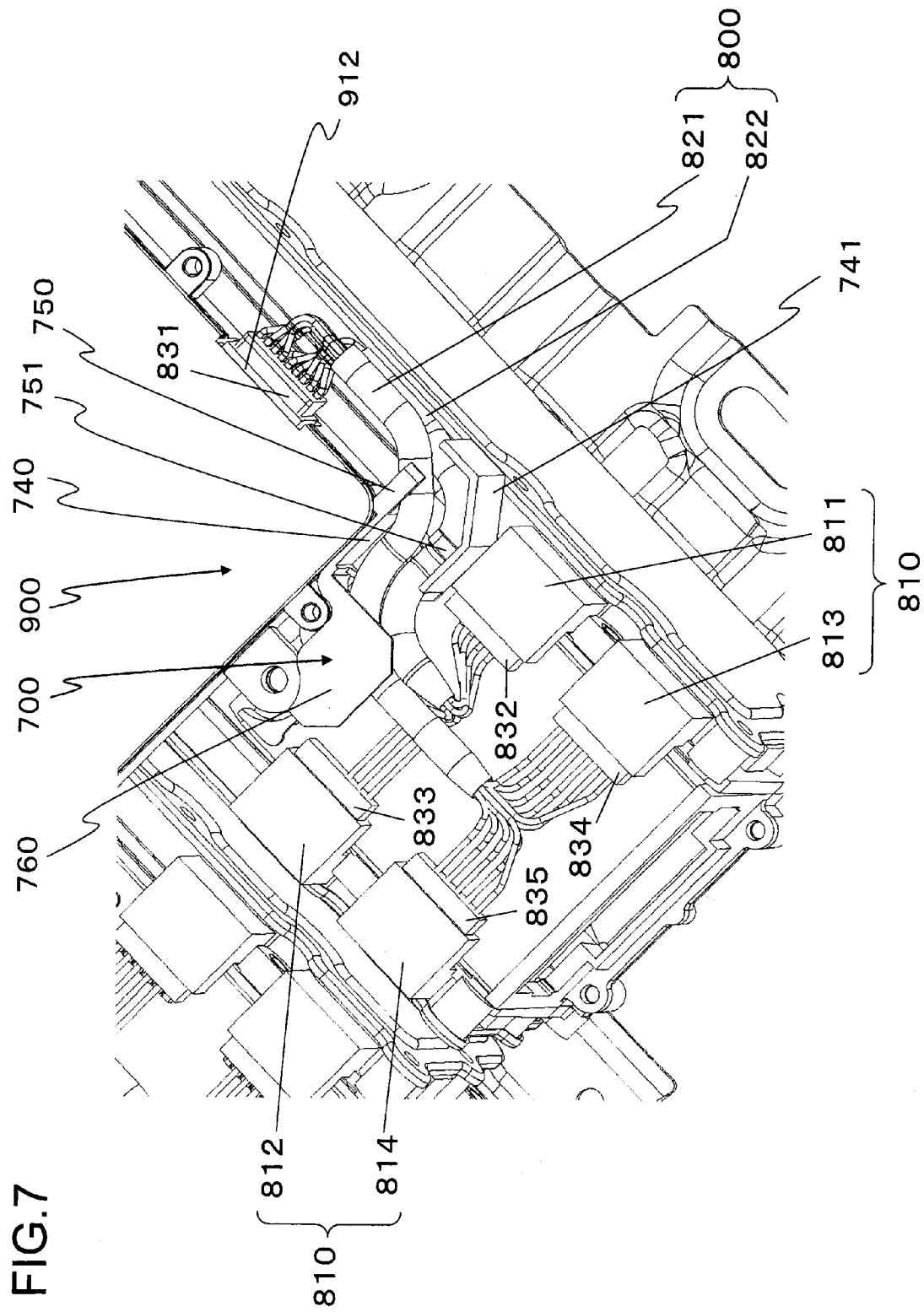
FIG. 7 presents an enlarged perspective view illustrating placement of harnesses and its immobilized state with harness guard.

As shown in FIG. 2, the connectors 912 are arranged on both ends of the control unit 900 along the shorter side direction, that is, on the sides that correspond respectively to the both sides of the higher potential side battery block 100a and the lower potential side battery block 100b. FIG. 7 shows the connection wires 800, one end of which is connected to the connector 912 on the higher potential side battery block side and another end of which is connected to the connection terminal 810. The connection terminal 810 provided on the higher potential side battery block 100a is constituted by four terminals designated by reference numerals 811 to 814, respectively. To the four connection terminals 811 to 814 are connected four connectors 832 to 835 provided on one end of the connection wires 800. A plurality of voltage detection lines connected to the four connectors 823 to 835, respectively, are bundled as two harnesses 821 and 822 by using insulating protective tubes. The insulating protective tubes can be formed by using a material that has a high degree of freedom of deformation, electrical insulating property and flame retardant property. In the present embodiment, a cylindrical silicone varnish glass tube is used. The other ends of the harnesses 821 and 822 are connected to one connector 831 to be connected to the connector 912 which is for the higher potential side battery block.

As mentioned above, a plurality of voltage detection lines for the plurality of the lithium ion battery cells 140 that constitutes the higher potential side battery block 100a are connected to the four connection terminals 811 to 814. Therefore, the connection wires 800 are a cable formed by bundling the plurality of the terminal voltage detection lines for detecting terminal voltages of the plurality of the lithium ion battery cells 140 and in the present embodiment is constituted by two harnesses 821 and 822. As mentioned above, one end of each voltage detection line of the two harnesses 821 and 822 is connected to one connector 831 and the other end of each voltage detection line of them is connected to the four connectors 832 to 835.

The harnesses 821 and 822 are arranged on the upper surfaces of the battery blocks 100a and 100b. On the upper surfaces of the battery blocks 100a and 100b are provided harness guards 700 and 710 that confine the arrangement of the harnesses 821 and 822 and protect the harness 821 and 822 from an external force applied from above. The harness guards 700 and 710 are integrally molded bodies made of a resin that has electrically insulating property, such as PBT.

As explained above, in the present embodiment, the voltage detection conductors that include a plurality of voltage detection lines for detecting voltages of the plurality of lithium ion secondary battery cells 140 are connected to the connection terminals 811 and 813 of the side plate 130 and to the connection terminals 812 and 814 of the side plate 131. The cell controller 200 (see FIG. 1) is provided with the connector 912 that transmits a detected voltage. The connection terminals 811 to 814 and the connector 912 are connected through the harness 800. On one side of the harness 800 are provided the four connectors 832 to 835 and on the other side thereof, is provided one connector 831 that is connected to the connector 912. The harness 800 includes two harnesses 821 and 822 each of which bundles a plurality of voltage detection lines with a resin-made protective cylinder. Therefore, the harnesses 821 and 822 in the present embodiment are each an assembly of voltage detection lines. For example, assuming that there are N voltage detection lines, N/2 voltage detection lines are bundled with a resin-made protection cylinder, thus forming two harnesses. The harnesses 821 and 822 are collectively called "harness" (connection wires) 800 and each harness is also called "wires".

Harness Guard

Figure 9:
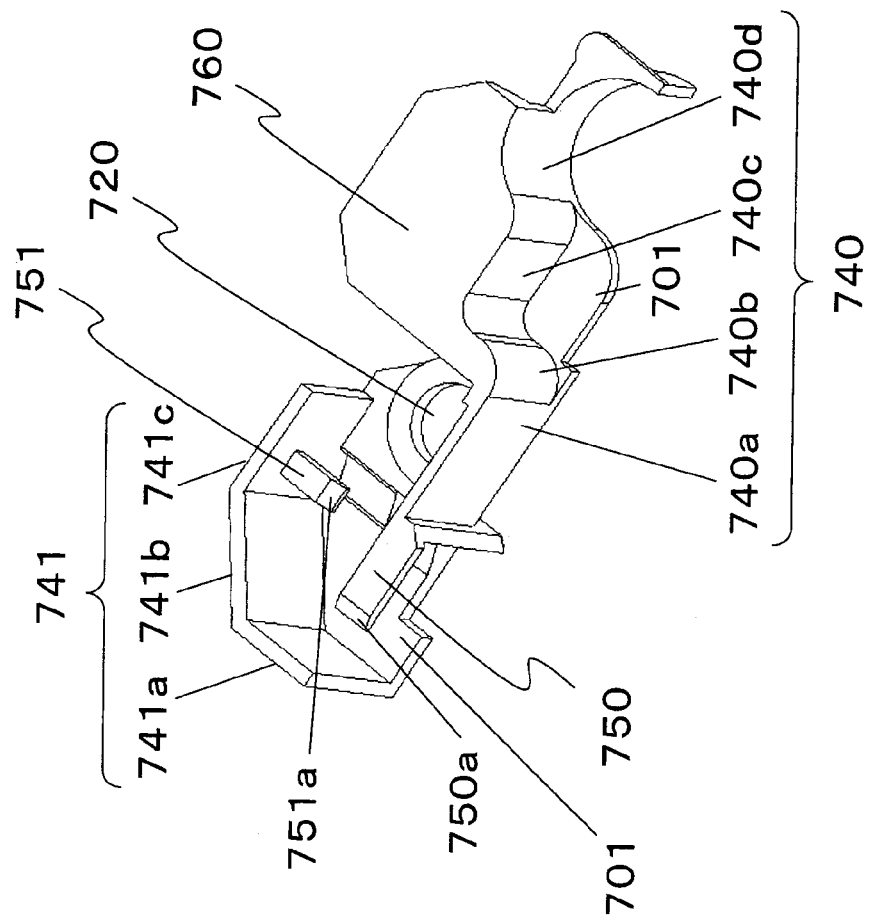
FIG. 9 presents a perspective view of the harness guard as seen from top side.
Figure 10:
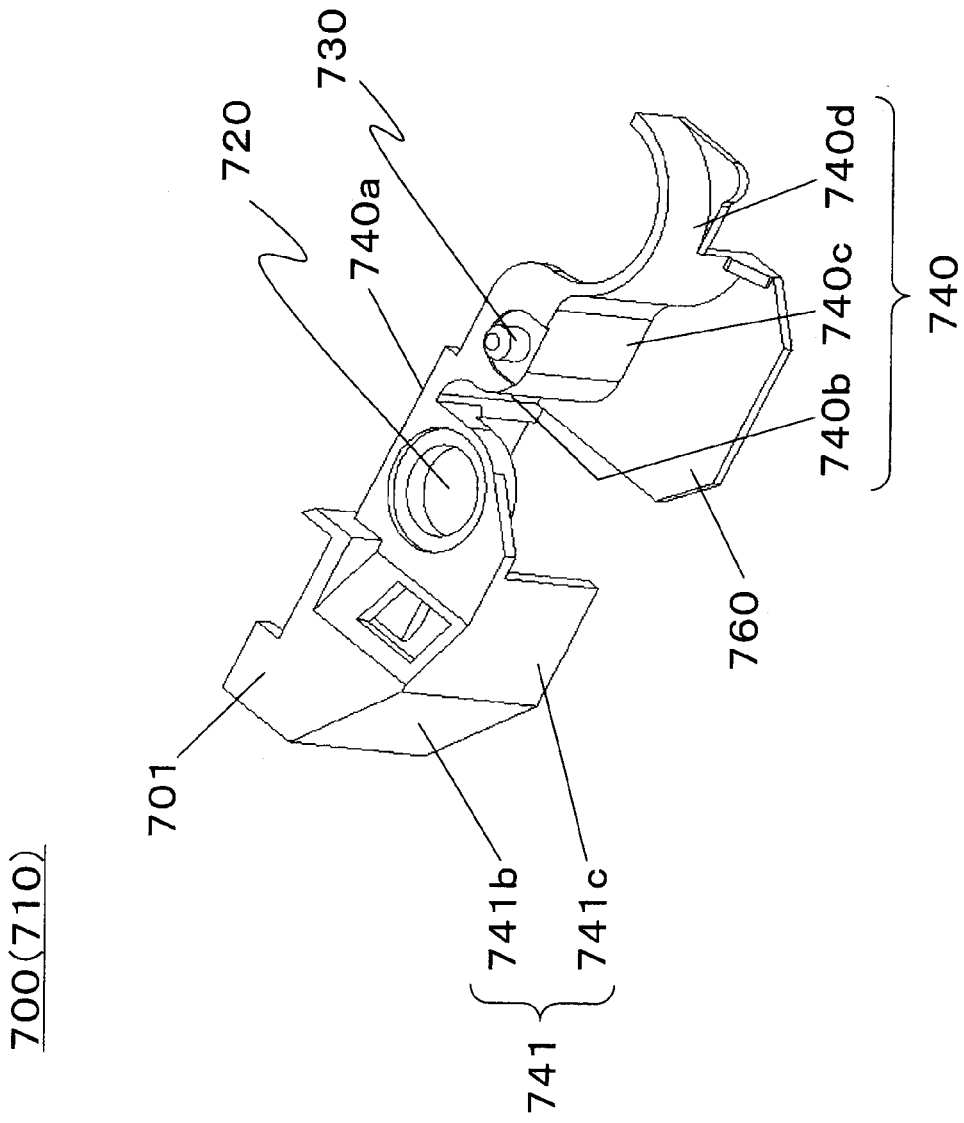
FIG. 10 presents a perspective view of the harness guard as seen from bottom side.

Now, the structure of harness guards 700 and 710 is explained with reference to FIGS. 8 to 10. Here, for simplicity of explanation, only the structure of the harness guard 700 set on the battery block 100a is explained. The other harness guard 710 is structured to be line-symmetric to the harness guard 700.

Figure 8:
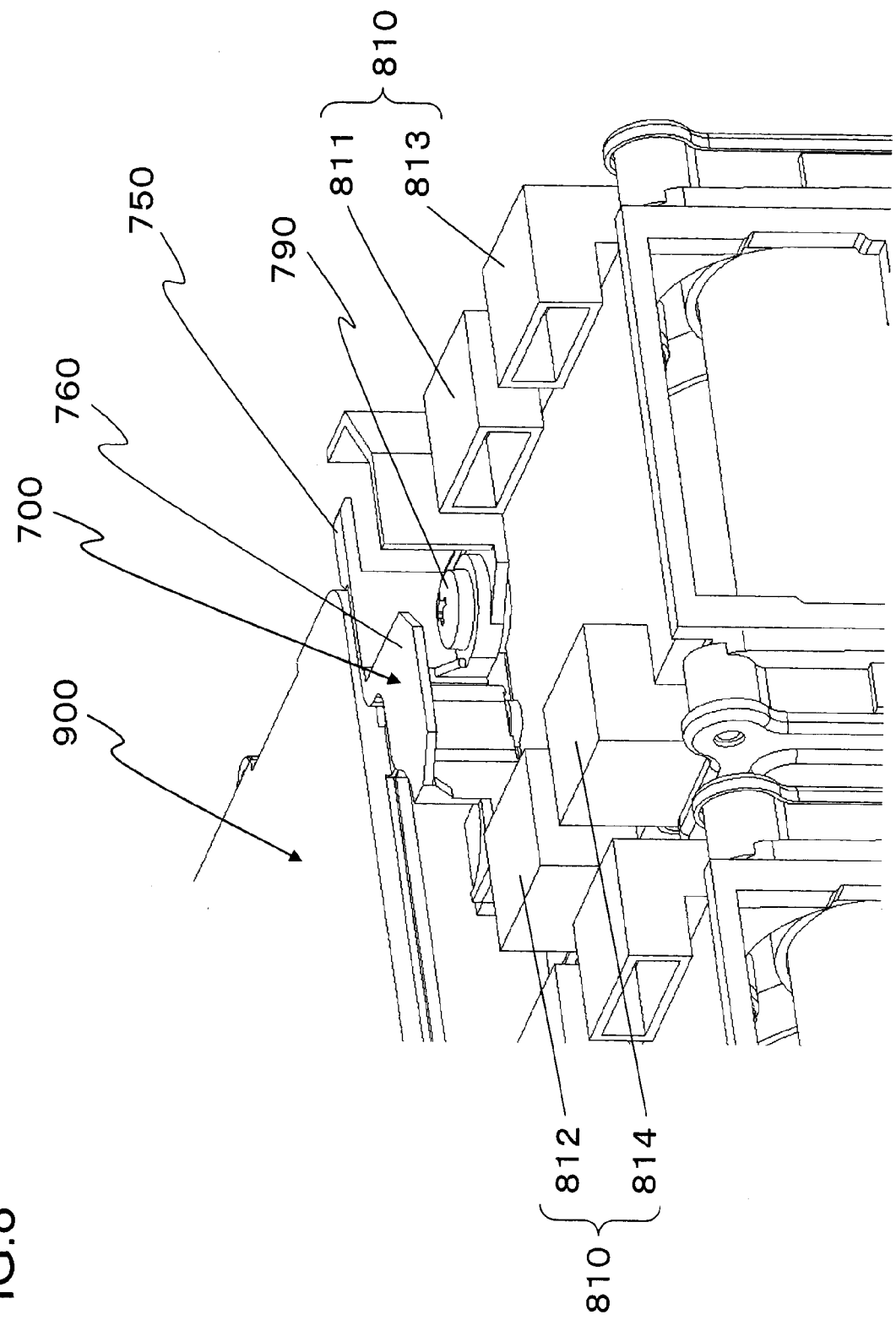
FIG. 8 presents an enlarged perspective view of mounting the harness guard to the battery block.

FIG. 8 presents a birds-eye view of the harness guard 700 set on the battery block 100a as seen from the coolant inlet 114 side. FIGS. 9 and 10 present each a perspective view of the harness guard 700 alone. It should be noted that FIG. 9 presents a birds-eye view of the harness guard 700 as seen from the control unit 900 side, and FIG. 10 presents a birds-eye view of the harness guard 700 shown in FIG. 9 as seen from the bottom surface side. The harness guard 700 confines the route of the harnesses 821 and 822 that extend along the longer side direction of the battery block from the connector 912 toward the coolant inlet 114 and prevent lifting up of the harnesses 821 and 822 and further protect the harnesses 821 and 822 against external force applied from above.

The harness guard 700 has a bottom plate 701 that is set in parallel to the inlet flow channel forming plate 111 of the battery block 100a, an outer wall 741 and an inner wall 740 rising from the bottom plate 701, and an upper wall 760 provided in parallel to the bottom plate 701 at a predetermined distance therefrom.

The bottom plate 701 of the harness guard 700 is provided with a through-hole 720. The harness guard 700 is fixed to the inlet flow channel forming plate 111 through the screw hole of a boss 116 (see FIG. 3) with the screw 790. On the back side of the bottom plate 701 of the harness guard 700 is provided a position adjusting pin 730 so as to project therefrom in order to prevent rotation of the harness guard 700 upon fixing the harness guard 700. By inserting the position adjusting pin 730 in a position adjusting hole 117 (see FIG. 3) provided in the inlet flow channel forming plate 111, the rotation of the harness guard 700 when the battery block 100a is attached is prevented, so that an error in position at which the harness guard 700 is mounted can be minimized.

The harness guard 700 is provided with an inner wall 740 and an outer wall 741 that are rising at right angles from the surface of the inlet flow channel forming plate 111 of the battery block 100a. The inner wall 740 has a guide part 740a that is arranged in parallel to the side on which the boss 932 of the chassis 930 is provided and guides the harness 821 along its inner surface; a first wall 740b and a second wall 740c that continue from the guide part 740a and curve so as to circumvent a fastening unit 931 of the chassis cover 920 and the chassis case 930; and a third wall 740d that continues from the second wall 740c and curves so as to circumvent the fastening unit at which the chassis case 930 is fastened to the battery block 100a, that is, to circumvent the fastening unit at which the boss 932 of the chassis case 930 is mounted on the mounting boss on the upper surface of the battery block 100a and fastened.

The outer wall 741 has a first wall 741a that is parallel to the side plate 130 of the battery block 100a; a second wall 741b that continues to the first wall 741a and is inwardly tilted toward the battery block at an angle of approximately 45 degrees; and a third wall 741c that continues to the second wall 741b and extends along the shorter side direction of the battery block. A harness space (harness route) formed between the inner wall 740 and the outer wall 741 has a width that is set to be greater than the diameters of the harnesses 821 and 822. The harnesses 821 and 822 in a state where they are arranged between the inner wall 740 and the outer wall 741 connect the connection terminal 810 and the voltage detection connector 912 by means of the connectors 832 to 835 on both sides thereon.

Now, the function of the harness guard 700 is explained. The inner wall 740 and the outer wall 741 confine the routes along which the harnesses 821 and 822 are distributed. That is, the two harnesses 821 and 822 extending from the connector 831 that is connected to the connector 912 are placed along the side plate 130 and inwardly bent at right angles toward the battery block while they are guided by the outer wall 741 so that they will not protrude outward from the side surface of the battery block 100a. In FIG. 7, the outer wall 741 confines in particular the harness 822 not to bulge outward. The harnesses 821 and 822, which have been bent toward the inside of the battery block, are further caused to change their route to the longer side direction of the battery block along the second wall 740b of the inner wall 740. The respective ends of the harnesses 821 and 822 whose route have been changed to run along the longer side direction of the battery block are each bifurcated in the shorter side direction of the battery block. To the respective ends of the voltage detection lines of the bifurcated harnesses 821 and 822 are connected four connectors 832 to 835 and the four connectors 832 to 835 are connected to the connector terminals 811 to 814, respectively.

In this manner, the harness guard 700 serves to prevent the control unit 900 from contacting to the harnesses 821 and 822, and also prevent the connection terminal 810 from contacting to the harnesses 821 and 822. The harness guard 700 also confines the routes along which the harnesses 821 and 822 placed such that the harnesses 821 and 822 are arranged closer to the control unit 900 than the cover plates 160 of the battery blocks 100a and 100b.

The harness guard 700 has also a function of preventing the harnesses 821 and 822 from being lifted up above the battery block 100a. This is explained in more detail as follows.

A claw-like protrusion 750 that extends along the shorter side direction of the battery block and perpendicular to a wall surface of the inner wall 740 is provided on the inner wall 740 of the harness guard, and a claw-like protrusion 751 that extends along the longer side direction of the battery block and perpendicular to a wall surface of the outer wall 741 is provided on the outer wall 741 of the harness guard 700. The distance between the end of the claw-like protrusion 750 and the first wall 741a of the outer wall 741 and the distance between the end of the claw-like protrusion 751 and a virtual surface of the inner wall 740 is smaller than the diameters of the harnesses 821 and 822. On the upper surface of the ends of the claw-like protrusions 750 and 751 are formed tilted surfaces 750a and 751a.

The distance between the end of the claw-like protrusion and the virtual surface of the inner wall 740 is defined as follows. That is, although there is no part of the inner wall 740 that faces the end of the protrusion 751, the above-mentioned distance is defined to be one obtained when it is assumed that the inner wall 740 would be extended to a position at which the end of the protrusion could be faced. More precisely, the inner surface of the inner wall 740 corresponds to a route side edge of the protrusion 750, so that the above-mentioned distance may be defined to be a distance between the route side edge of the protrusion 750 and the end of the protrusion 751.

On the inner wall 740 of the harness guard 700 is provided an upper wall 760 that faces the bottom plate 701 at a predetermined distance therebetween like a window roof.

Harness and Procedure of Assembly of Harness Guard

A method of assembling the lithium ion battery device 1000 concerning placement of the harness guards 700 and 710 and wiring part of connection wiring are explained.

First, the lithium ion battery device 1000 except for the harness guards 700 and 710 and the connection wires 800 is assembled and then the harness guards 700 and 710 are fixed to the upper part of the inlet flow channel forming plate 111 with the screw 790. Thereafter, the connector 831 for one of the harnesses 821 and 822 is connected to the voltage detection connector 912, and the other connectors 832 to 835 of the harnesses 821 and 822 are connected to the connection terminals 811 to 814, respectively.

When the harnesses 821 and 822 connected to the connector 912 are arranged on the upper surface of the battery block 100a, the harnesses 821 and 822 that extend along the longitudinal side of the battery block 100a from the connector 912 side are bent in the shorter side direction along the route confined by the harness guard 700 to form a first bent portion, which portion is pressed from above the claw-like protrusions 750 and 751 inwardly toward the harness guard 700. As a result, the harnesses 821 and 822 are guided by the tilted surfaces 750a and 751a of the ends of the claw-like protrusions 750 and 501, respectively, to be pressed into the space between the inner wall 740 and the outer wall 741 and inserted beneath the claw-like protrusions 750 and 751. The protrusions 750 and 751 prevent the harnesses 821 and 822 from being lifted up at the first bent portion.

Further, the harnesses 821 and 822 that have been bent at the first bent portion and inserted beneath the claw-like protrusions 750 and 751 are guided along the second wall 740b and the third wall 740c of the inner wall 740 to be bent along the longitudinal direction of the battery block to form a second bent portion and inserted on the lower surface of the upper wall 760. That is, the harnesses 821 and 822 are wired beneath the upper wall 760. As a result, the harnesses 821 and 822 are prevented from being lifted up at the second bent portion, so that the height of the upper surface of the electric storage device 1000 can be adjusted to be within the predetermined size.

The electric storage device 1000 provided with the above-mentioned harness guards 700 and 710 according to the present invention provides the following advantageous effects.

(1) The harnesses 821 and 822 do not escape from the claw-like protrusions 750 and 751 of the harness guard 700 and the upper wall 760, so that the lifting up of the harnesses 821 and 822 upon their arrangement can be reliably prevented. As a result, the total height of the lithium ion battery device 1000 does not vary. The harnesses 821 and 822 will not escape from the side surfaces of the battery blocks 100a and 100b thanks to the harness guard 700. Therefore, the lithium ion battery device 1000 can be mounted without inconveniences on those vehicles that are limited with respect to space for mounting various devices, such as electric cars and hybrid cars. In other words, when the harnesses 821 and 822 are placed, it is possible to achieve constant wiring at designated positions within the sizes ranges determined in the design stage without being affected by environmental conditions.

(2) The harness guards 700 and 710 can protect the harnesses 821 and 822 against external forces from the sides of the upper surface of the lithium ion battery device 1000 and the cover plate 160.

(3) By using the harness guard 700 made of a resin as a holding fixture of the harnesses 821 and 822, it can be avoided that fixtures such as cable ties inside the lithium ion battery device 1000 is accidentally not used or the fixtures are accidentally left inside the lithium ion battery device 1000 can be avoided, and thus fixing of the harnesses 821 and 822 can be performed with ease. Therefore, fixation of the harnesses 821 and 822 can be performed with the same supporting force.

(4) With the method of fixing and supporting harnesses by use of cable ties as in the case of the electric storage device disclosed in the conventional technology (JP 2008-154332 A1), full automation of assembly work is difficult. However, if the harness guards 700 and 710 are fixed to the battery block 100a in advance according to the above-mentioned embodiment, it is only necessary thereafter to press the harnesses 821 and 822 into the routes in the harness guards 700 and 710, so that it becomes easier to realize automation of the assembly work of the electric storage device. In manual operations of assembling the electric storage device by using the cable ties, there is a possibility that the cable ties are accidentally not applied or the cable ties are accidentally left in the electric storage device. However, according to the above-mentioned embodiment, the harness guards 700 and 710 are fixed to the battery block 100a in advance, fixing of the harnesses will never be accidentally skipped. Since no cable ties are used, there is no fear of leaving the cable ties in the electric storage device 1000.

(5) By covering the harnesses 821 and 822 with silicone varnish glass tubes (insulating protective tubes), the harnesses 821 and 822 can be protected from external forces. The silicone varnish glass tubes can be more freely deformed than the plastic-made tubes that have been conventionally used, so that fixation of the harnesses 821 and 822 to the harness guard 700 can be done easier than ever. Since the silicone varnish glass tubes are flame retardant, the harnesses 821 and 822 can be thermally protected.

The above-mentioned embodiment can be practiced in the following variations.

(1) According to the above-mentioned embodiment, explanation has been made on the electric storage module in which the higher potential side battery block 100a and the lower potential side battery block 100b are arranged side by side. Therefore, the harness guard 700 is used for the harness of the battery block 100a and the harness guard 710 is used for the harness of the battery block 100b. However, the present invention may also be applied to an electric storage device that is constituted by only one battery block 100a.

(2) According to the above-mentioned embodiment, the harness guard 700 confines the positions of the harnesses 821 and 822 in a direction parallel to the upper surface 111 of the battery block by means of the inner wall 740 and the outer wall 741 and also confines the positions of the harnesses 821 and 822 in a direction perpendicular to the upper surface 111 of the battery block by means of the claw-like protrusions 750 and 751 and the upper wall 760. And the inner wall 740 and the outer wall 741 as well as the claw-like protrusions 750 and 751 and the upper wall 760 that perform two respective positional confinements are integrally molded. However, the inner wall 740 and the outer wall 741 as well as the claw-like protrusions 750 and 751 and the upper wall 760 that perform two respective positional confinements may be configured to be two separately molded components. Alternatively, (a) the inner wall 74, the protrusion 750, and the upper wall 760 and (b) the outer wall 741 and the protrusion 751 may be provided as separate members. The harness guard may be constituted by either one component or a plurality of components so far as the harness guard can confine the route of the harnesses by being fixed to the battery block in advance. Therefore, the harness guard may also be constituted by three members.

(3) According to the above-mentioned embodiment, the connector 912 of the control unit 900 is provided on the side surface of the chassis case along the longitudinal direction of the battery blocks 100a and 100b and the harnesses 821 and 822 connected to the connector 912 are allowed to extend along the side plate 130 of the battery block. Further, the harnesses 821 and 822 are bent inward toward the inside of the battery block by means of the inner wall 740 and the outer wall 741 of the harness guards 700 and 710 and then the harnesses 821 and 822 are arranged on the upper surface 111 of the battery block again along the longitudinal direction of the battery block by means of the second wall 740b and the third wall 740c of the inner wall 740. However, the surface on which the connector 912 of the control unit is arranged may be other surfaces than the above-mentioned one, that is, it may be provided on the side surface of the chassis case along the shorter side direction of the battery block.

(4) Number of times of bending the harnesses 821 and 822 depends on the orientations of the connector 912 and of the connection terminals 811 to 814. When the orientations of the connection terminals 811 to 814 are opposite along the shorter side direction of the battery block, the harnesses 821 and 822 are bent at least two times between the connector 912 and the connection terminals 811 to 814. When the connector 912 is provided on the side surface of the chassis that extends along the shorter side direction of the battery block 100a, the harnesses 821 and 822 must be bent at least once and the structure of the harness guard may be adapted depending on the manner of distribution of the harnesses.

(5) Other ends of the wirings 800 are each branched into four connection terminals 811 to 814. However, the other ends of the wires 800 may be configured to be one connector or branched into two or three connectors. In other words, the number of connection terminals and the number of connectors may be set appropriately in accordance with the number of battery cells enclosed in one battery block 100a.

(6) According to the above-mentioned embodiment, the claw-like protrusions 750 and 751 are provided so as to correspond to the first bent portions of the harnesses 821 and 822 and the upper wall 760 is provided so as to correspond to the second bent portions of the harnesses 821 and 822 in order to prevent lifting up of the harnesses 821 and 822. However, when there is one bent portion, only one member is sufficient for preventing the lifting up. Accordingly, when there are three or more bent portions, three or more members for preventing the lifting up are necessary. Of course, the members for preventing the lifting up for the plurality of bent portions may be replaced by only one member.

(7) According to the above-mentioned embodiment, the harnesses 821 and 822 formed by bundling voltage detection lines for detecting the terminal voltage of the battery has been explained. However, the present invention may be applied to the harness guards 700 and 710 that guide/protect the harnesses including detection lines that are used in detecting other physical quantities for monitoring the state of the battery, for example, battery cell temperature. Moreover, it is also possible to apply the harness guards according to the present invention for such a harness configured with detection lines for the output voltage of temperature sensors which are provided for temperature measurements of many storage cells or at many points in the battery block.

The present invention is not limited to the above-mentioned embodiment and variations. In short, the present invention may be applied to various electric storage devices that include the battery block 100a with the chassis 110 with a plurality of storage cells installed therein; the control unit 900 that is arranged on one surface 111 of the chassis 110 and monitors the state of the plurality of the storage cells 140 by inputting signals concerning physical quantities of the plurality of the storage batteries 140; a plurality of wires 821 and 822 arranged on one surface 111 of the chassis 110 in which the control unit 900 is placed, extending from the battery block 100a to the control unit 900; and the confining member 700 that is fixed on the surface 111 of the chassis 110 in which the control unit 900 is placed and that confines the route along which the plurality of wires 821 and 822 is arranged in a plane parallel to the one surface 111 of the chassis 110 with bent portions, the confining member 700 including the first direction restrainers 740 and 741 that guide the wires 821 and 822 in response to reaction force upon bending the plurality of the wires 821 and 822 and second direction restrainers 750, 751, and 760 that restrain the force by which the plurality of the wires 821 and 822 that have been inserted in the route tend to be lifted up in the leaving direction from the one surface 111 of the chassis 110.

The above described embodiments are exemplary and various modifications can be made without departing from the scope of the invention.

What is claimed is:

1. An electric storage device, comprising:
a battery block including a chassis provided with
a chassis body having a plurality of storage cells installed therein so that axes of the storage cells are parallel to each other, the chassis body being formed with openings at sides thereof facing positive electrode terminals and negative electrode terminals of the plurality of storage cells, and
a pair of side plates that cover the openings of the chassis body and hold the plurality of storage cells by sandwiching therebetween the plurality of storage cells from sides of the positive electrode terminals and the negative electrode terminals, the side plates each being provided at a circumferential surface thereof with a connection terminal for outputting signals concerning physical quantities of the storage batteries;

a control unit that is placed on one surface of the chassis at which the connection terminal is provided and monitors states of the plurality of storage cells, by inputting signals concerning respective physical quantities of the plurality of storage cells through a connector provided along one of the side plates;

wires that transmit the signals concerning the respective physical quantities of the plurality of storage cells from the battery block to the control unit and that respectively have on one end thereof a first connector connected to the connector of the control unit in a direction from the one of the side plates and on the other end thereof a second connector connected to the connection terminal in a direction opposite to a connection direction in which the first connector is connected to the connector of the control unit, and are arranged on one surface of the chassis in which the connection terminal and the control unit are placed, extending from one of the first connector and the second connector to the other of the first connector and the second connector, with the wires being covered with an insulating member to be divided into at least two groups; and a confining member that is provided on the one surface of the chassis in which the connection terminal and the control unit are placed and defines, within a predetermined size range between the connection terminal and the connector of the control unit, a route along which the wires are arranged such that while the wires are prevented from contacting the control unit and the connection terminal, from protruding from the one of the side plates to outside, and from being lifted up over a predetermined height in a direction in which the wires leave the one surface of the chassis in which the connection terminal and the control unit are placed, the wires are enabled to be arranged on the one surface of the chassis in which the connection terminal and the control unit are placed, wherein the confining member includes:

a first wall section that includes an outer wall provided so as to rise up in a direction of leaving the one surface of the chassis in which the connection terminal and the control unit are placed, and that defines with the outer wall a route for bending the wires extending from the first connector toward the one of the side plates in a direction toward an inner side of the battery block and restraining protrusion of the wires to the outside of the one of the side plates caused by a reaction force accompanying the bending of the wires toward the inside of the battery block;

a first protrusion that protrudes from the outer wall into the route defined by the first wall section and presses the wires arranged in the route defined by the first wall section to prevent a first bent portion of the wires formed by bending the wires in a direction toward the inside of the battery block from being lifted up in a direction leaving the one surface of the chassis in which the connection terminal and the control unit are placed;

a second protrusion that protrudes at a position facing the outer wall and presses the wires arranged in the route defined by the first wall section to prevent the first bent portion of the wires formed by bending the wires in a direction toward the inside of the battery block from being lifted up in a direction of leaving the one surface of the chassis in which the connection terminal and the control unit are placed, and a second wall section that includes an inner wall provided so as to rise up from the one surface of the chassis in which the connection terminal and the control unit are placed and bend the wires bent by the outer wall, along the one of the side plates, in the same direction as a direction toward the connection terminal, and a wall that is provided so as to face the one surface of the chassis in which the connection terminal and the control unit are placed at a predetermined distance to restrain a second bent portion of the wires by bending the wires in the same direction as the direction toward the connection terminal from being lifted up in a direction leaving the one surface of the chassis in which the connection terminal and the control unit are placed within a predetermined size of height.

2. An electric storage device according to claim 1, wherein a restraining member is integrally molded.

3. An electric storage device according to claim 2, wherein the confining member includes a rotation preventing member that prevents rotation of the confining member in cooperation with a rotation preventing unit provided on the one surface of the battery block.

4. An electric storage device according to claim 1, wherein the wires are connected at its one end to a single connector, and are divided into four groups at its another end and are connected to four branched connectors, respectively, the single connector is connected to a connector that is fixed to the control unit, and the four branched connectors are connected respectively to four connection terminals provided to the battery blocks for signals concerning physical quantities.

5. An electric storage device according to claim 4, wherein the wires connected to the single connector is confined by the confining member to be bent twice at a first bent portion and a second bent portion to be arranged along longitudinal direction of the battery block, the wires, which are bent at the second bent portion and are divided into the four groups, are respectively connected to the four branching connectors provided on both shorter sides of the battery block, with two of the four groups on each of the both shorter sides.

6. An electric storage device according to claim 4, wherein the connector of the control unit that is connected to the single connector is arranged along a shorter side direction of the battery block.

7. An electric storage device according to claim 1, wherein the wirings are each covered with a silicone varnish glass tube.

8. An electric storage device according to claim 1, wherein:
there are provided two battery blocks, each corresponding to the battery block;
the two battery blocks are arranged juxtaposed such that respective longitudinal directions of the two battery blocks are parallel to each other; and
the control unit is installed so as to bridge the two battery blocks.

* * * * *